US010535836B2

(12) United States Patent
Kim et al.

(10) Patent No.: US 10,535,836 B2
(45) Date of Patent: Jan. 14, 2020

(54) DISPLAY DEVICE WITH ROLLABLE DISPLAY PANEL

(71) Applicant: LG Display Co., Ltd., Seoul (KR)

(72) Inventors: Jeonghun Kim, Goyang-si (KR); Bongchul Kim, Gyeongsangbuk-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/046,763

(22) Filed: Jul. 26, 2018

(65) Prior Publication Data
US 2019/0036067 A1   Jan. 31, 2019

(30) Foreign Application Priority Data

Jul. 31, 2017   (KR) .......................... 10-2017-0096878

(51) Int. Cl.
  *G06F 1/16*   (2006.01)
  *H05K 5/00*   (2006.01)
  *H01L 51/52*  (2006.01)
  *H01L 51/00*  (2006.01)

(52) U.S. Cl.
  CPC ........ *H01L 51/5237* (2013.01); *G06F 1/1601* (2013.01); *G06F 1/1652* (2013.01); *H05K 5/006* (2013.01); *H05K 5/0017* (2013.01); *H05K 5/0069* (2013.01); *G06F 2200/1612* (2013.01); *H01L 51/0097* (2013.01); *H01L 2251/5338* (2013.01)

(58) Field of Classification Search
  CPC ........... G06F 1/1652; H01L 2251/5338; H01L 51/5237; H01L 51/0097; G09F 9/301; G09F 11/30; G09F 11/02; H05K 5/0017; H05K 5/006; H05K 5/0069; H04M 1/0268
  See application file for complete search history.

(56) References Cited

U.S. PATENT DOCUMENTS

| 9,098,241 B1* | 8/2015 | Cho ...................... H05K 1/028 |
| 2014/0347827 A1 | 11/2014 | Lee et al. |
| 2016/0187929 A1* | 6/2016 | Kim ...................... G06F 1/1652 345/184 |
| 2017/0156220 A1 | 6/2017 | Heo et al. |

FOREIGN PATENT DOCUMENTS

| JP | 2007-41556 A | 2/2007 |
| JP | 2008-52040 A | 3/2008 |
| JP | 2016-24460 A | 2/2016 |
| JP | 2016-130853 A | 7/2016 |
| KR | 10-2016-0081786 A | 7/2016 |
| KR | 10-2017-0048007 A | 5/2017 |

* cited by examiner

*Primary Examiner* — James Wu
(74) *Attorney, Agent, or Firm* — Seed IP Law Group LLP

(57) ABSTRACT

The present disclosure provides a display device comprising: a rollable display panel configured to display an image; a display-panel roller, the display panel being fixed thereto; and a support frame, the display-panel roller being rotatably coupled to the frame, wherein the display-panel roller includes: first and second elongate half-circularly rounded plates to face away each other to form a substantially cylindrical elongate inner space; and first and second support annular rings spaced from each other, wherein the first and second support annular rings are disposed in the inner space. Thus, the rollable display panel may be more easily fixed to the display-panel roller.

7 Claims, 14 Drawing Sheets

(a)

(b)

<Roll Up>

<Unroll Down>

DISPLAY DEVICE WITH ROLLABLE DISPLAY PANEL

CROSS-REFERENCE TO RELATED APPLICATIONS

This application claims the priority of Korean Patent Application No. 10-2017-0096878 filed on Jul. 31, 2017, in the Korean Intellectual Property Office, the disclosure of which is hereby incorporated by reference in its entirety.

BACKGROUND

Technical Field

The present disclosure relates to a display device with a rollable display panel.

Description of the Related Art

As the information technology has developed gradually, a market of display devices as communication means used to transmit information to users is increasing. In this connection, display devices such as an organic light emitting display (OLED), a liquid crystal display (LCD), and a plasma display panel (PDP) are increasingly employed.

The organic light emitting display (OLED) includes a display panel including a plurality of sub-pixels, and a driver for driving the display panel. The driver includes a scan driver configured to supply a scan signal or a gate signal to the display panel, and a data driver configured to supply a data signal to the display panel.

The organic light emitting display (OLED) may have flexibility. Thus, the display panel thereof may be bent or curved. Further, the display panel may be rolled in a roll shape and then extend in a flat shape. In recent years, a variety of structures have been designed to accommodate the flexible display panel of the organic light emitting diodes (OLEDs).

BRIEF SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

The present disclosure provides a configuration in which a rollable display panel may be more easily fixed to a display-panel roller.

The present technique reduces scratches in a surface of the rollable display panel when the display panel is wound around the display-panel roller in a display device with the rollable display panel.

The present disclosure provides a configuration in which an external device may be easily connected to a built-in circuit board inside the display-panel roller in the display device with the rollable display panel.

In accordance with the present disclosure, there is provided a display device comprising: a rollable display panel configured to display an image; a display-panel roller, the display panel being fixed thereto, the roller being elongate; and a support frame, the display-panel roller being rotatably coupled to the frame, wherein the display-panel roller includes: first and second elongate half-circularly rounded plates to face away each other to form a substantially cylindrical elongate inner space; and first and second support annular rings spaced from each other, wherein the first and second support annular rings are disposed in the inner space, wherein an outer face of each of the first and second support annular rings face-contacts an inner face of each of the first and second plates.

In one embodiment, the first and second support annular rings divide the inner space into three inner sub-spaces arranged in a length direction of the roller.

In one embodiment, the device further comprises a circuit board connected to the display panel, wherein the board is disposed between the first and second support rings.

In one embodiment, each of the first and second support rings has a groove defined therein, wherein the board is partially inserted into the groove.

In one embodiment, the circuit board has a shoulder at an edge thereof, wherein the shoulder is inserted into the groove.

In one embodiment, a first elongate gap is defined between the first and second elongate half-circularly rounded plates, wherein the display panel passes through the first gap.

In one embodiment, the device further comprises a circuit board connected to the display panel, wherein the board is disposed between the first and second support rings, wherein a second gap is defined between the first and second elongate half-circularly rounded plates, wherein an electric contact on the board is exposed outwardly through the second gap.

In one embodiment, portions of the first and second elongate half-circularly rounded plates adjacent to the first gap have different thicknesses with a difference corresponding to a thickness of the display panel.

In one embodiment, the device further comprises driving means configured to rotate the display-panel roller with respect to the support frame, wherein the driving means is disposed in one of the three inner sub-spaces except for a middle inner sub-space thereof.

In the display device with the rollable display panel according to the present disclosure, the display-panel roller for winding the display panel may be manufactured by assembling the divided first and second elongate half-circularly rounded plates and first and second support rings. As a result, the circuit board of the display panel may be fixed between the first and second support rings. The display panel may be drawn through the gap between first and second elongated half-circularly rounded plates. Further, the assembling between the display panel and the roller may be improved.

Further, when the thickness of the display panel is increased, a step is not formed at a portion of the display panel where the display panel starts along and on the display-panel roller. For this reason, the first and second elongate half-circularly rounded plates have different outer diameters, thereby reducing the occurrence of scratches in the front face of the display panel.

Further, the electric contact provided on the printed circuit board is exposed through the second gap. Thus, an external inspection means may connect to the printed circuit board through the electric contact to inspect the circuit board or perform firmware upgrade on the circuit board. Thus, it is not necessary to disassemble the elongate display-panel hollow roller to connect for the external circuit to the circuit board.

DETAILED DESCRIPTION

Figure 1:
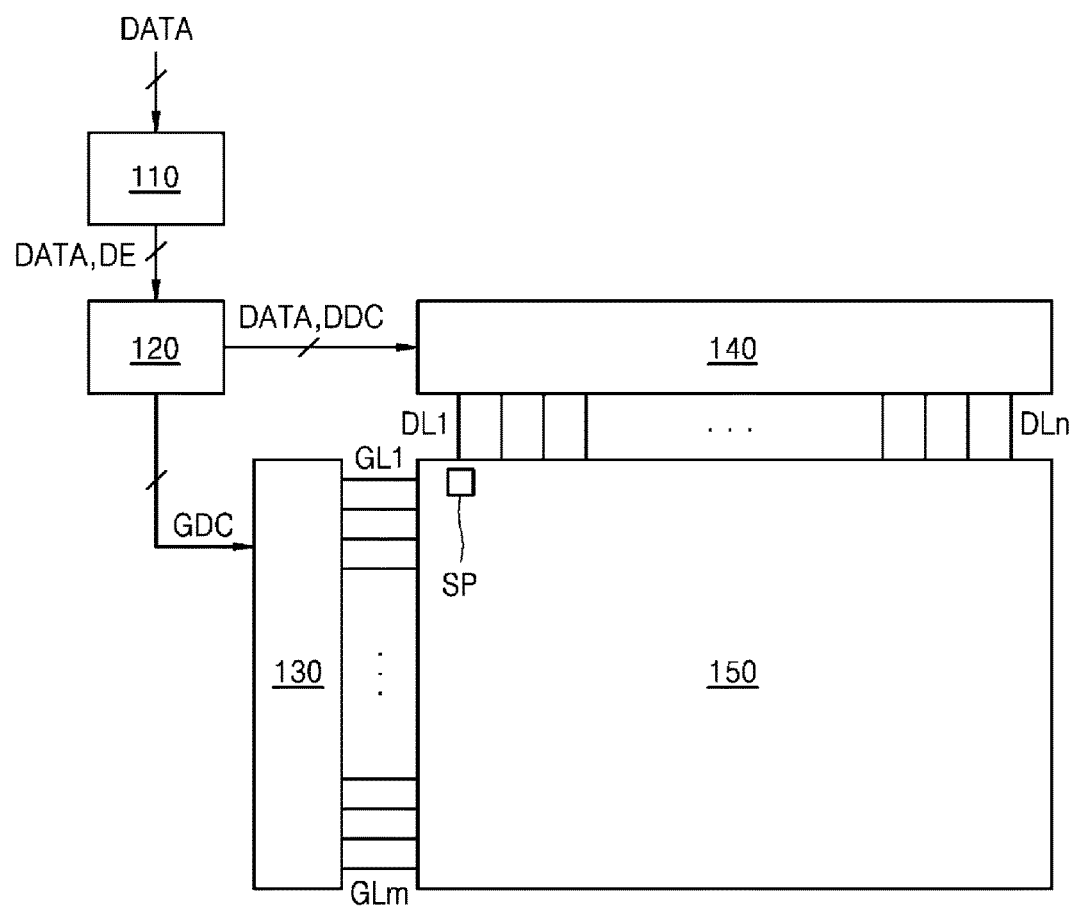
FIG. 1 is a block diagram of an organic electroluminescent display device according to an embodiment of the present disclosure.

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, a display device with a rollable display panel according to the present disclosure will be described in detail with reference to the accompanying drawings.

Hereinafter, an organic electroluminescent display device will be described as an example of implementing a display device with a rollable display panel. However, the present disclosure is not limited thereto. Any display panel capable of implementing a display device with a rollable display panel may be applied to the present disclosure.

Figure 2:
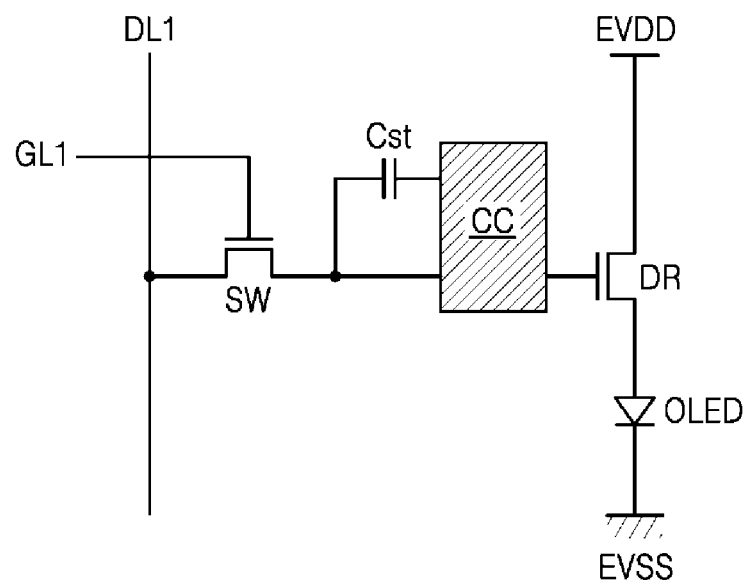
FIG. 2 shows a circuit diagram of a sub-pixel.
Figure 3:
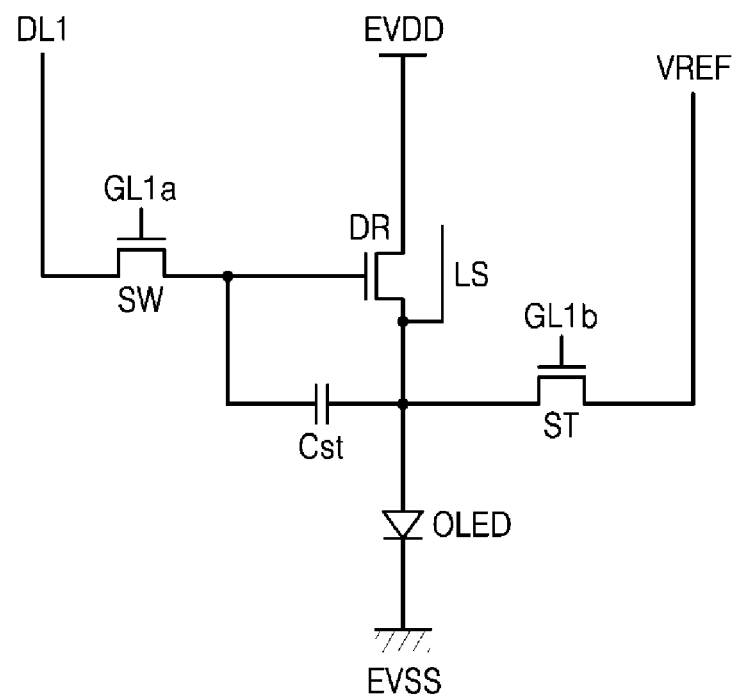
FIG. 3 shows an example of a sub-pixel configuration according to an embodiment of the present disclosure.

FIG. 1 is a block diagram of an organic electroluminescent display device according to an embodiment of the present disclosure. FIG. 2 shows a schematic circuit diagram of a sub-pixel. FIG. 3 shows a structure of a sub-pixel according to an embodiment of the present disclosure.

As shown in FIG. 1, an organic electroluminescent display device according to an embodiment of the present disclosure includes an image processing unit 110, a timing control unit 120, a data driver 140, a scan driver 130, and a display panel 150.

The image processing unit 110 may be configured to output a data enable signal DE together with a data signal DATA supplied from the outside.

In addition to the data enable signal DE, the image processing unit 110 may be configured to output at least one of a vertical synchronization signal, a horizontal synchronization signal, and a clock signal. These signals have been omitted from the drawings for convenience of illustration.

The timing control unit 120 may be configured to receive the data signal DATA in addition to a drive signal including the data enable signal DE or the vertical synchronization signal, the horizontal synchronization signal, and the clock signal from the image processing unit 110. The timing control unit 120 may be configured to output a gate timing control signal GDC for controlling an operation timing of the scan driver 130 based on the drive signal and to output a data timing control signal DDC for controlling an operation timing of the data driver 140 based on the drive signal.

In response to receiving the data timing control signal DDC supplied from the timing control unit 120, the data driver 140 may be configured to sample and latch the data signal DATA supplied from the timing control unit 120, and, then, to convert the sample and latched data signal into a gamma reference voltage and to output the gamma reference voltage. The data driver 140 outputs the data signal DATA via data lines DL1 to DLn. The data driver 140 may be implemented as an IC (Integrated Circuit).

The scan driver 130 may be configured to output the scan signal while shifting the level of the gate voltage in response to the reception of the gate timing control signal GDC supplied from the timing control unit 120. The scan driver 130 outputs a scan signal through the scan lines GL1 to GLm. The scan driver 130 may be implemented as an IC integrated circuit, or may be formed in the display panel 150 in a GIP (gate in panel) manner.

The display panel 150 may be configured to display an image based on the data signal DATA and the scan signal supplied from the data driver 140 and the scan driver 130. The display panel 150 includes sub-pixels SP operable to display an image.

The sub-pixel may be implemented as a top-emission type, a bottom-emission type, or a dual-Emission type depending on a structure thereof.

The sub-pixels SP may include a red sub-pixel, a green sub-pixel, and a blue sub-pixel. Alternatively, the sub-pixels SP may include a white sub-pixel, a red sub-pixel, a green sub-pixel, and a blue sub-pixel. The sub-pixels SP may have at least one different light emission area, based on the light emission characteristics thereof.

As shown in FIG. 2, one sub-pixel includes a switching transistor SW, a driving transistor DR, a capacitor Cst, a compensation circuit CC, and an organic light emitting diode OLED.

The switching transistor SW is configured to perform a switching operation in response to the reception of the scan signal supplied through the first scan line GL1 so that the data signal supplied via the first data line DL1 is stored as a data voltage in the capacitor Cst. The drive transistor DR is configured to allow a drive current to flow into between a first power supply line EVDD and a second power supply line EVSS in accordance with the data voltage stored in the capacitor Cst. The organic light emitting diode OLED operates to emit light using the drive current from the drive transistor DR.

The compensation circuit CC may be a circuit added within the sub-pixel to compensate a threshold voltage of the drive transistor DR. The compensation circuit CC may include at least one transistor. A configuration of the compensation circuit CC varies greatly depending on a compensation method thereof. An example thereof is as follows.

As shown in FIG. 3, the compensation circuit CC includes a sensing transistor ST and a sensing line VREF. The sensing transistor ST is connected to a node (hereinafter referred to as a sensing node) between a source line of the drive transistor DR and an anode of the organic light emitting diode OLED. The sensing transistor ST is configured to supply an initialization voltage (or a sensing voltage) transmitted through the sensing line VREF to the sensing node or to sense a voltage or current of the sensing node.

The switching transistor SW includes a first electrode connected to the first data line DL1 and a second electrode connected to the gate electrode of the drive transistor DR. The drive transistor DR has a first electrode connected to the first power line EVDD and a second electrode connected to the anode of the organic light emitting diode OLED. The capacitor Cst has a first electrode connected to the gate electrode of the drive transistor DR and a second electrode connected to the anode of the organic light emitting diode OLED. The organic light emitting diode OLED has an anode connected to the second electrode of the drive transistor DR and a cathode connected to the second power line EVSS. The sensing transistor ST has a first electrode connected to the sensing line VREF and a second electrode connected to the anode of the organic light emitting diode OLED.

As used herein, the first electrode and the second electrode are defined as a source electrode and a drain electrode, or a drain electrode and a source electrode, respectively, based on the type of the transistor.

An operating time of the sensing transistor ST may be similar to or different from the operating time of the switching transistor SW, depending on the configuration or the compensation algorithm of the compensation circuit. In one example, the switching transistor SW has a gate electrode connected to a first sub-scan line GL1a, while the sensing transistor ST has a gate electrode connected to a second sub-scan line GL1b. In another example, the first sub-scan line GL1a coupled to the gate electrode of the switching transistor SW and the first sub-scan line GL1b coupled to the gate electrode of the sensing transistor ST may be shared by both transistors SW and ST.

The sensing line VREF may be connected to the data driver. In this case, the data driver may sense the sensing node of the sub-pixel during a non-display period of the image or an N frame (N is an integer of 1 or more) period, or in real time, and then, may allow the compensation circuit to perform the compensation based on the sensing result. In one example, the switching transistor SW and the sensing transistor ST may be turned on at the same time. In this case, the sensing operation through the sensing line VREF and the data output operation for outputting the data signal are distinguished from each other based on a time division by the data driver.

In addition, data to be compensated based on the sensing result may include a digital based data signal, an analog based data signal or a gamma voltage, and the like. Further, the compensation circuit for generating the compensation signal or the compensation voltage based on the sensing result may be implemented inside the data driver, inside the timing control unit, or as a separate circuit.

In FIG. 3, a sub-pixel having a 3T (transistors) 1C (capacitor) structure including the switching transistor SW, drive transistor DR, capacitor Cst, organic light emitting diode OLED, and sensing transistor ST is illustrated as an example. However, the present disclosure is not limited thereto. When the compensation circuit CC is added in the sub-pixel, the sub-pixel may include 3T2C, 4T2C, 5T1C, or 6T2C structure, or the like.

Because the organic electroluminescent display device as described above does not require a backlight unit, the organic electroluminescent display device may have a thinner display panel than that of a liquid crystal display. Further, since the display panel of the organic electroluminescent display device may be flexible as thin as possible, the display panel may be bent or curved. Further, the panel may be deformed in a rolled shape or the like.

Therefore, in recent years, various types of mechanical structures for housing display panels of the organic electroluminescent display devices have been designed. Hereinafter, a structure of a display panel that is rollable or extendable to implement a display device with a rollable display panel will be described.

Figure 4:
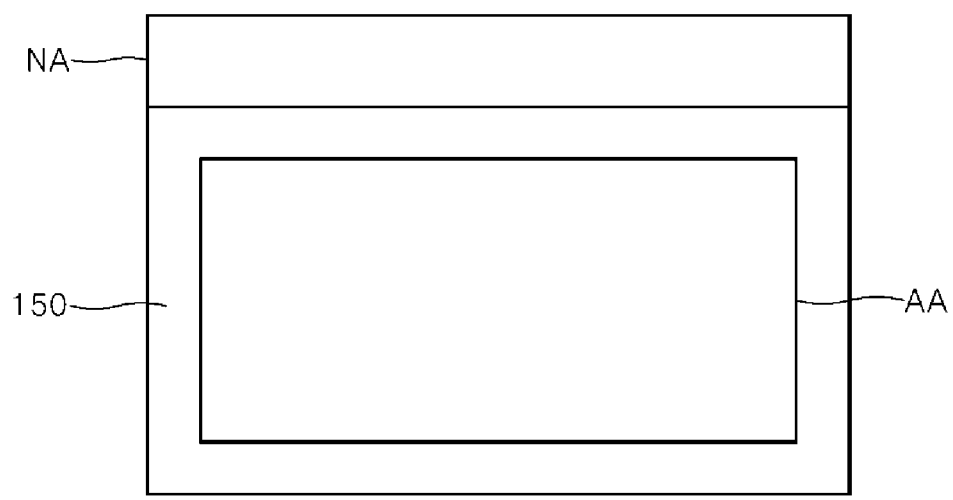
FIG. 4 is a plan view of a display panel according to an embodiment of the present disclosure.
Figure 5:
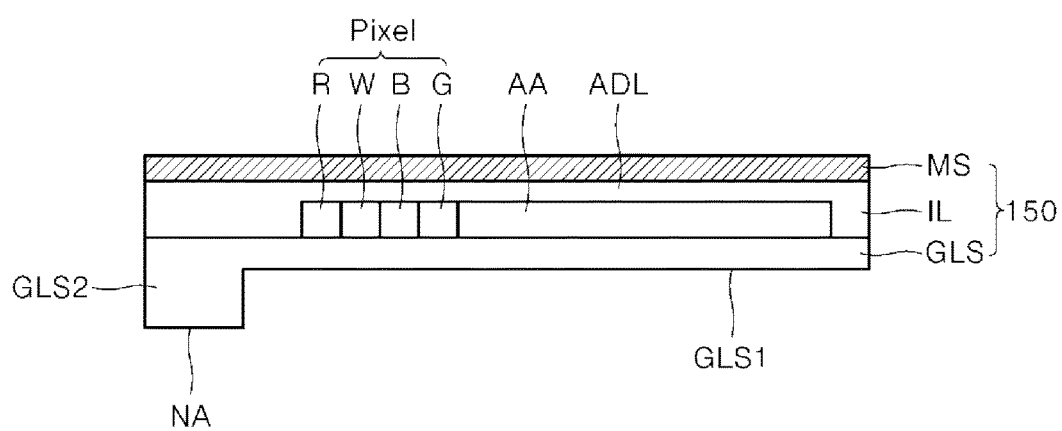
FIG. 5 is a cross-sectional view of a display panel according to an embodiment of the present disclosure.
Figure 6:
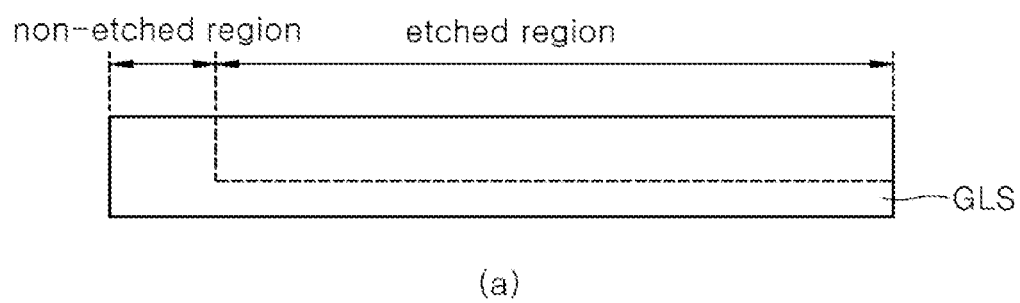
FIG. 6 is a sectional view showing an example of etching of a first substrate.
Figure 6:
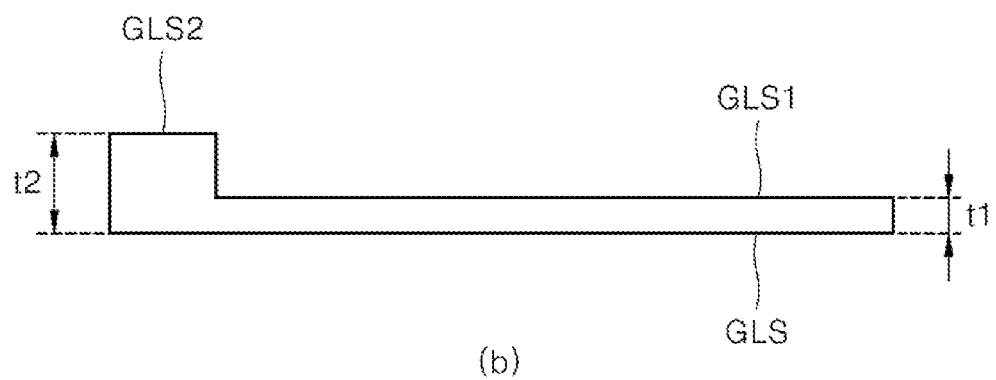
Figure 7:
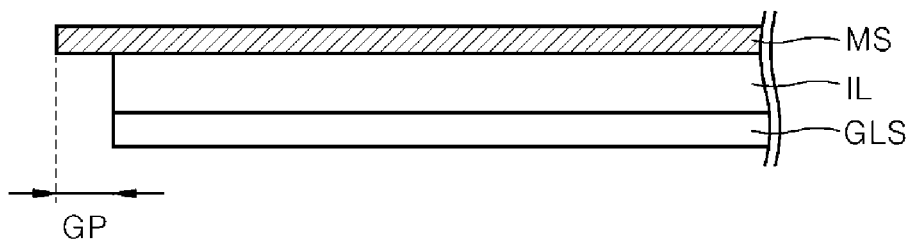
FIG. 7 is a sectional view showing an example of bonding between first substrate and second substrate.
Figure 8:
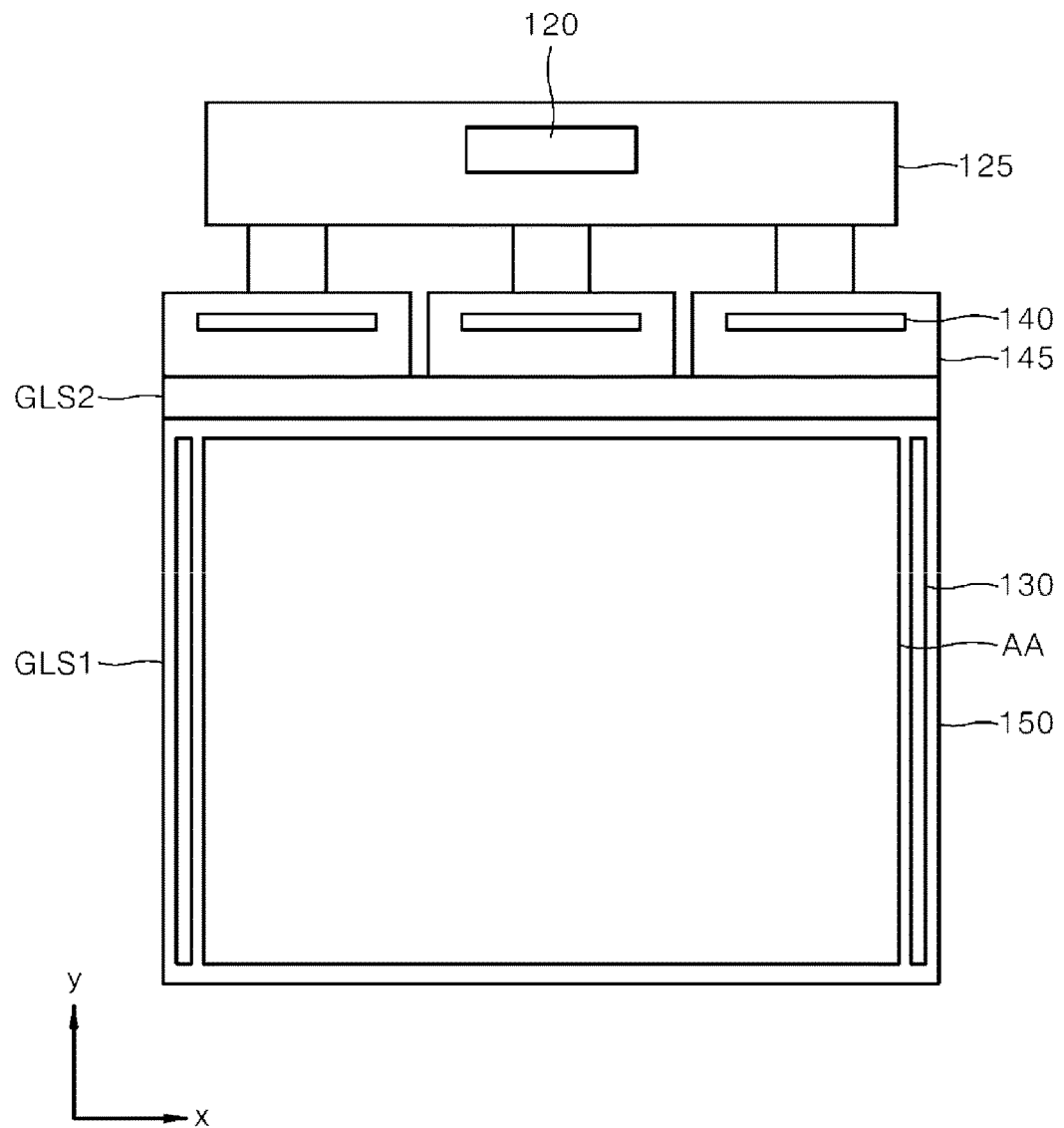
FIG. 8 is a plan view showing a modularized display panel.

FIG. 4 is a top view of an exemplary display panel according to an embodiment of the present disclosure. FIG. 5 is a cross-sectional view of an exemplary display panel according to an embodiment of the present disclosure. FIG. 6 is a cross-sectional view showing an example etching of a first substrate. FIG. 7 is a cross-sectional view of a first substrate and second substrate as bonded together. FIG. 8 is a plan view of a modular display panel.

As shown in FIGS. 4 to 8, a display panel 150 according to an embodiment of the present disclosure includes a first substrate GLS, an intermediate layer IL having a display region AA including a plurality of pixels, and a second substrate MS.

The intermediate layer IL has an adhesive layer ADL in addition to the plurality of pixels constituting the display region AA. The plurality of pixels may include sub-pixels configured for emitting red R, white W, blue B and green G light beams. However, the present disclosure is not limited thereto. The adhesive layer ADL may be made of an adhesive material which enables bonding between first substrate GLS and second substrate MS, and seals the intermediate layer IL located between the first substrate GLS and the second substrate MS.

The first substrate GLS may be made of glass or resin. A thickness of the first substrate GLS may be 0.01 mm to 0.2 mm.

From experimental results, it may be confirmed that when the thickness of the first substrate GLS is as thin as 0.01 mm to 0.1 mm, and even when the first substrate is made of glass instead of resin, the first substrate may be rolled into a rolled state or may be unrolled in an extended state.

The first substrate GLS has an etched region (etched portion) GLS1 and a non-etched region (non-etched portion) GLS2. On the non-etched region GLS2, a pad for connection with an external substrate may be disposed. The non-etched region GLS2 has an elongated rectangular shape.

In the non-etched region GLS2, the first substrate may be connected to an external substrate. The non-etched portion enhances the rigidity of the substrate. To this end, it is desirable that the non-etched region GLS2 occupies 5% to 10% of a total area of the first substrate GLS. Further, the non-etched region GLS2 has a higher rigidity than that of the etched region GLS1. To this end, the thickness t2 of the non-etched region GLS2 is preferably selected to be in a range of from 0.1 mm to 0.2 mm.

Except for the non-etched region GLS2, the first substrate is partially removed by an etching process to form the etched region GLS1. The etched region GLS1 is provided to mitigate a tensile stress that the first substrate GLS may receive when the display panel 150 is rolled in a rolled state or is unrolled in an extended state. For this purpose, a thickness t1 of the substrate in the etched region GLS1 is preferably selected from the range of 0.01 mm to 0.1 mm.

The second substrate MS may be made of metal. A thickness of the second substrate MS may be selected from a range of 0.01 mm to 0.2 mm. The second substrate MS absorbs, disperses and alleviates the tensile stress that the first substrate GLS may receive when the display panel 150 is coiled in a rolled state or is unrolled in an extended state.

From experimental results, it may be confirmed that when the thickness of the second substrate MS is as thin as 0.01 mm to 0.2 mm, the second substrate effectively absorbs, disperses and alleviates the tensile stress that the first substrate GLS may receive when the display panel 150 is coiled in a rolled state or is unrolled in an extended state.

Since the second substrate MS is made of a metal material, the second substrate is more resistant to impact than the first substrate GLS. As a result, the second substrate MS may be made larger than the first substrate GLS. That is, the second substrate MS may have a protruding region GP in which the second substrate protrudes outward, as compared to the first substrate GLS. The protruding region may exist at one or more positions. Further, the protrusion region GP of the second substrate MS may effectively serve to protect a corner of the first substrate from an impact that the first substrate GLS may otherwise receive.

Meanwhile, the display panel 150 may be electrically connected to the timing control unit 120, data driver 140, scan driver 130, and the like (the image processing unit or power supply unit is not shown). As a result, the display panel is modularized as shown in FIG. 8.

The scan driver 130 is formed in the display panel 150 in a gate-in-panel fashion. The data driver 140 is implemented in the source substrate 145. The timing control unit 120 and the like are mounted in the control substrate 125.

In order to coil the display panel 150 in a rolled state, it may be preferable to form the scan driver 130 to the left side and/or the right side of the display region AA in a GIP (Gate In Panel) manner. However, the present disclosure is not limited thereto. Further, the data driver 140 may be mounted in the source substrate 145 serving as a flexible circuit board, while the timing control unit 120 and the like may be mounted in the control substrate 125 serving as the printed circuit board. However, the present disclosure is not limited thereto. Further, the source substrate 145 and the control substrate 125 may be connected with each other via a cable. However, the present disclosure is not limited thereto.

Hereinafter, a mechanical structure for implementing a display device with a rollable display panel will be described.

Figure 9:
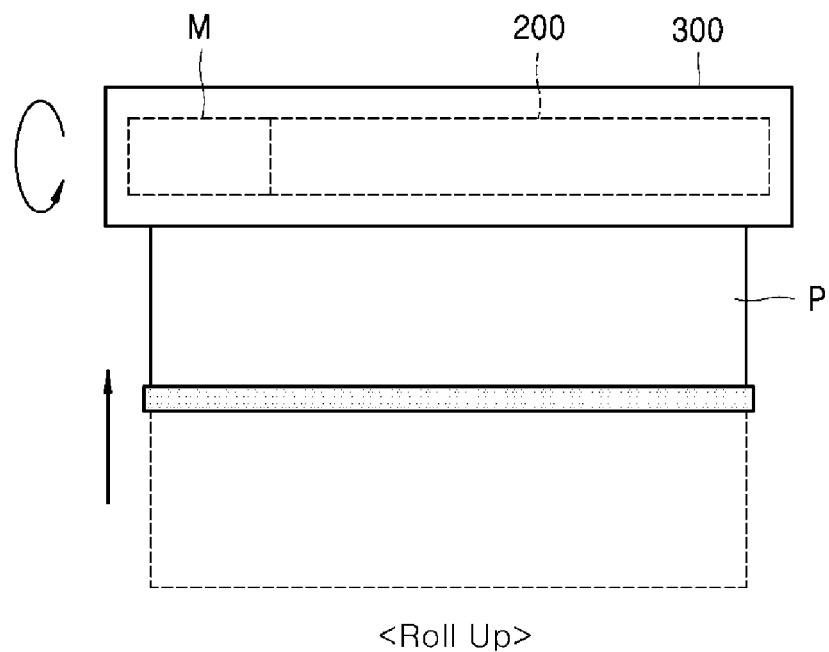
FIGS. 9 and 10 show a display device with a rollable display panel according to an embodiment of the present disclosure.
Figure 10:
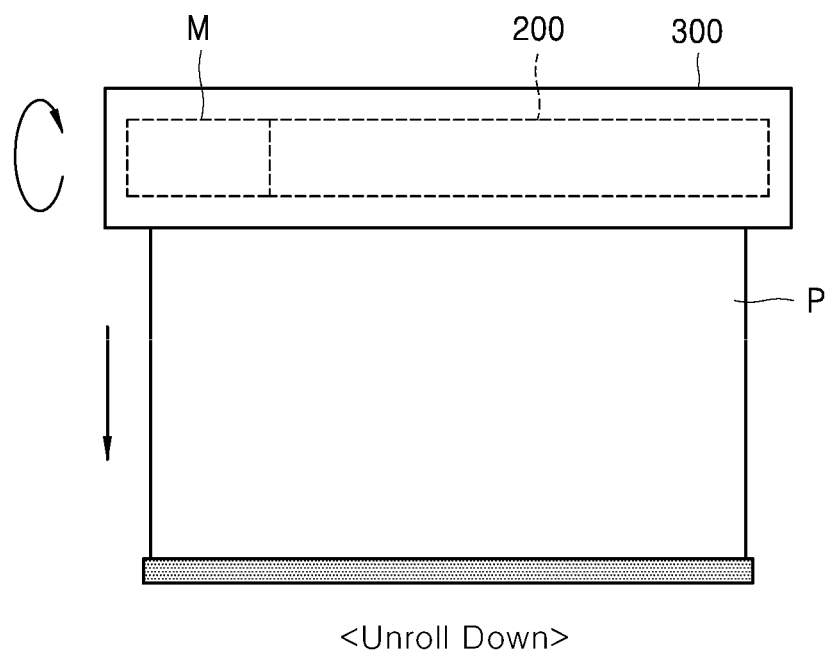

FIG. 9 and FIG. 10 show a display device with a rollable display panel according to an embodiment of the present disclosure.

As shown, the display device with a rollable display panel according to an embodiment of the present disclosure includes a display panel P for displaying an image, and a rolling and unrolling mechanism for rolling up or unrolling down the display panel P.

The rolling and unrolling mechanism includes an elongate display-panel hollow roller 200 to which the display panel P is fixed, a support frame 300 to which the display-panel roller is rotatably coupled, and a drive motor M for providing a driving force for rotating the display-panel roller relative to the support frame.

A weight bar is coupled to the lower end of the display panel P. The weight bar keeps the entire face of the display panel flat. The weight bar serves to pull down the panel P so that the display panel P may smoothly descend.

The weight bar may be made of a metal material, a synthetic resin material, a natural material, or a combination thereof.

For example, the weight bar may be formed of a stack of a metal material layer and a synthetic resin material layer. Alternatively, the weight bar may be a stack of a metal layer and a natural wood layer or a stone layer.

The weight bar may be attached to the display panel P with an adhesive. Alternatively, the weight bar may be fixed to the display panel P using fastening means.

The drive motor M rotates the display-panel roller 200 in both directions. As shown in FIG. 10, when the drive motor M rotates the display-panel roller 200 in a first direction, e.g., clockwise, the display panel P unrolls down. As shown in FIG. 9, when the drive motor M rotates the display-panel roller 200, in a second direction, e.g., counterclockwise, the display panel P is rolled up.

The present disclosure is directed to the elongate display-panel hollow roller 200 that is coupled to the display panel P and winds the display panel P around its outer surface.

Figure 11:
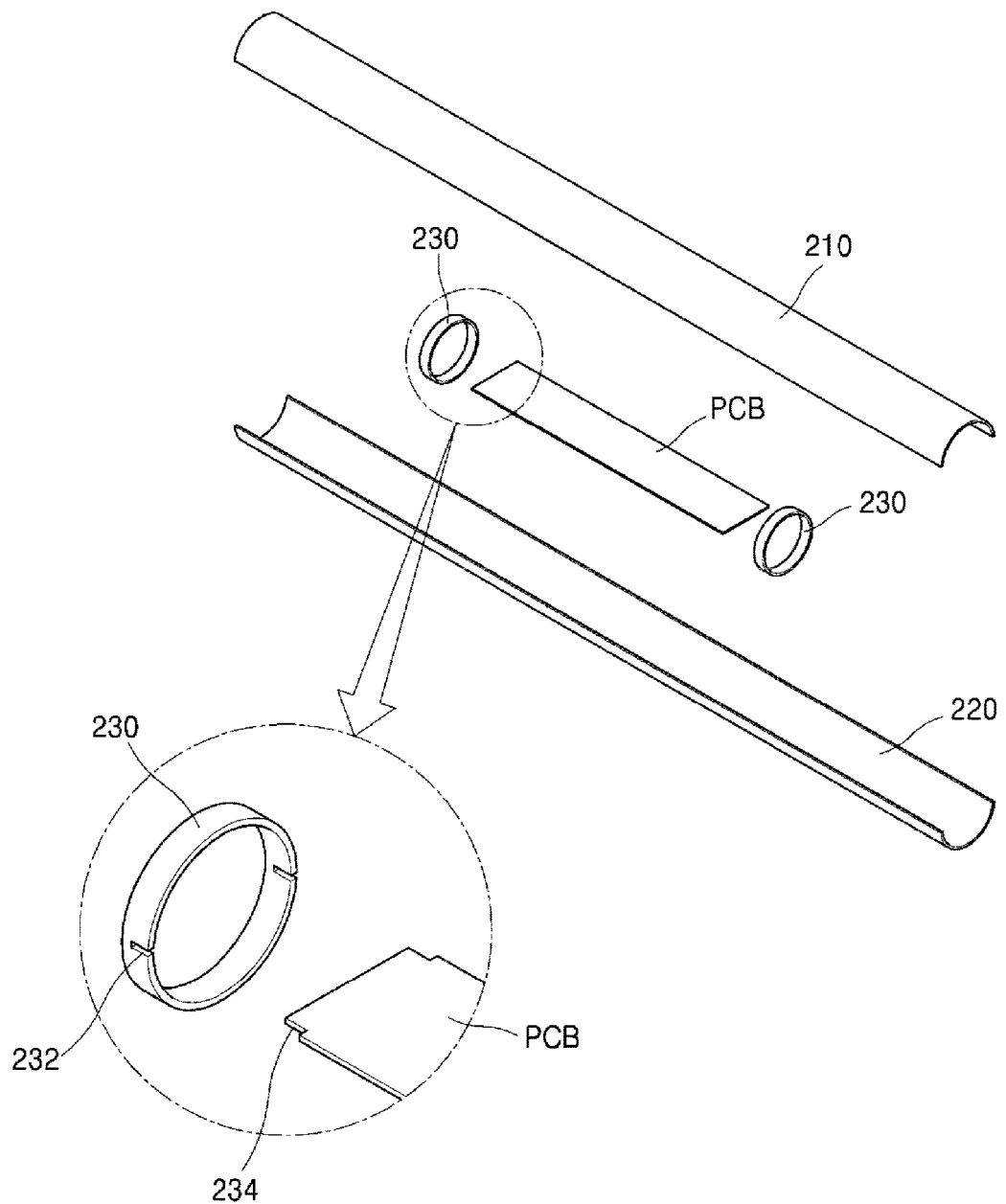
FIG. 11 is an exploded perspective view showing an elongate display-panel hollow roller of a display device with a rollable display panel according to an embodiment of the present disclosure.
Figure 12:
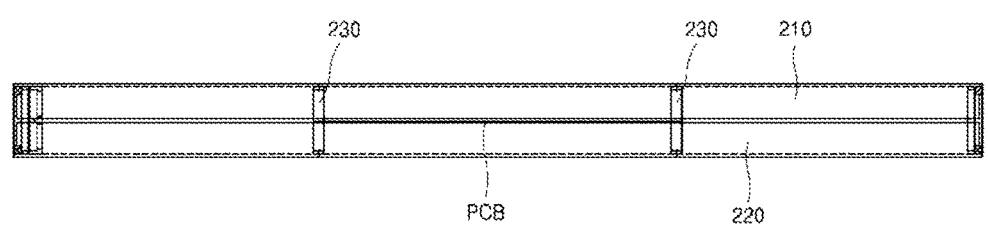
FIG. 12 shows an assembled state of the elongate display-panel hollow roller of the display device with the rollable display panel according to the embodiment of the present disclosure.

FIG. 11 is an exploded perspective view showing an elongate display-panel hollow roller of a display device with a rollable display panel according to an embodiment of the present disclosure. FIG. 12 shows an assembled state of the elongate display-panel hollow roller of the display device with the rollable display panel according to the embodiment of the present disclosure.

As shown, as shown, an elongate display-panel hollow roller 200 according to an embodiment of the present disclosure includes first and second elongate half-circularly rounded plates 210 and 220, and first and second support rings 230.

The first and second elongate half-circularly rounded plates 210 and 220 face away each other to form an inner space. The first and second elongate half-circularly rounded plates 210 and 220 are in contact with the first and second support rings 230 which are disposed in the inner space.

The first and second support rings 230 face-contact the inner faces of the first and second elongate half-circularly rounded plates 210 and 220. The first and second elongate half-circularly rounded plates 210 and 220 face away each other to form a substantially hollow cylindrical body.

The first and second support rings 230 are arranged in the inner space defined by the first and second elongate half-circularly rounded plates 210 and 220 facing away each other. The first and second support rings 230 are arranged to be spaced from each other in the inner space such that the inner space are divided into three sub-inner spaces. The three sub-inner spaces may be arranged in the length direction of the panel roller 200. Between the first and second support rings 230, a printed circuit board PCB of the display panel P may be disposed. That is, the PCB is disposed in the middle inner sub-space in the sub-inner spaces. Further, each driving mean may be disposed in each of the sub-inner spaces around the middle inner sub-space. In this way, the display device with the rollable display panel may have a reduced size.

The printed circuit board PCB may serve as the control substrate 125 described above.

The first and second elongate half-circularly rounded plates 210 and 220 as facing away each other are assembled with the first and second support rings 230 to form a hollow cylindrical panel-roller 200. When the hollow cylindrical panel-roller 200 is divided into the separate first and second elongate half-circularly rounded plates 210 and 220, the assembly thereof may be facilitated. Further, the display panel P may be reliably secured to the elongate display-panel hollow roller 200.

When the first and second elongate half-circularly rounded plates 210 and 220 are assembled using the spaced first and second support rings 230, the first and second support rings 230 may divide the inner space defined by the first and second elongate half-circularly rounded plates 210 and 220 facing away each other into the three inner sub-spaces.

In the middle sub-space between the first and second support rings 230, the printed circuit board PCB for the display panel P may be received. Each driving mean may be disposed in each of the sub-inner spaces around the middle inner sub-space. In this way, the display device with the rollable display panel may have a reduced size as described above.

Each of the first and second support rings 230 may have a groove 232 defined therein into which an edge of the circuit board PCB for the display panel P is inserted.

While the edge of the circuit board PCB for the display panel P is inserted in the groove 232 of each of the first and second support rings 230, the first and second support rings 230 may be assembled with the first and second elongate half-circularly rounded plates 210, thereby to form the elongate display-panel hollow roller 200 and, at the same time, allow the coupling between the elongate display-panel hollow roller 200 and display panel P. This provides the effect that the printed circuit board PCB may be firmly fixed to the central region of the elongate display-panel hollow roller 200 without separate fastening means.

In this connection, the corner of the printed circuit board PCB may have a shoulder 234 to keep the connection between the printed circuit board PCB and the first and second support rings 230 more robust. The shoulder 234 of the circuit board PCB is constrained within the groove 232 of each of the first and second support rings 230. This allows the printed circuit board PCB and first and second support rings 230 to be stably coupled together.

Figure 13:
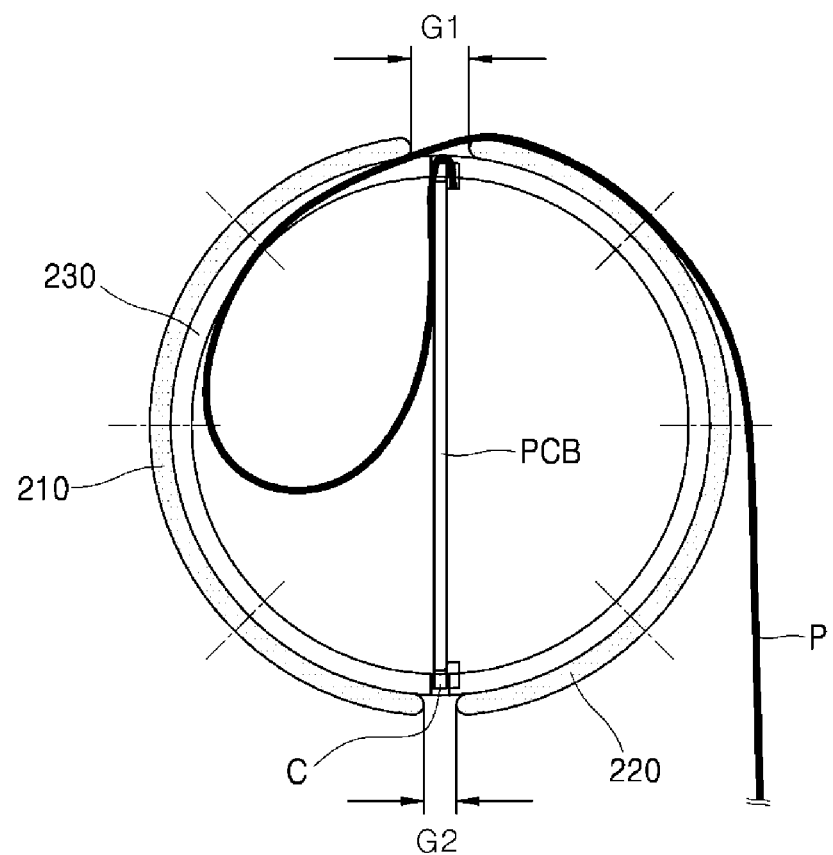
FIG. 13 shows the display panel assembled on the display-panel roller according to an embodiment of the present disclosure.

FIG. 13 shows the display panel assembled on the display-panel roller according to an embodiment of the present disclosure.

As shown, the printed circuit board PCB of the display panel P is coupled to the first and second support rings 230.

The first and second elongate half-circularly rounded plates 210 and 220 are assembled with the first and second support rings 230 such that a first elongate gap G1 is defined between the first and second elongate half-circularly rounded plates 210 and 220. In other words, the first and second elongate half-circularly rounded plates 210 and 220 do not wrap the entire outer surface of the first and second support rings 230, but partially wraps the outer surface of the first and second support rings 230. That is, the first and second elongate half-circularly rounded plates 210 and 220 are assembled away from each other.

The display panel P passes through the first elongate gap G1 and then is drawn out of the inner space defined by the first and second elongate half-circularly rounded plates 210 and 220. This allows the printed circuit board of the display panel P to be firmly fixed to the elongate display-panel hollow roller 200. Further, it is possible to reduce the damage of the display panel when the display panel P is wound around the roller.

The first and second elongate half-circularly rounded plates 210 and 220 are assembled with the first and second support rings 230 such that a second elongate gap G2 is defined between the first and second elongate half-circularly rounded plates 210 and 220. In this connection, the second elongate gap G2 may be opposite to the first elongate gap G1. It is preferable that an electric contact C provided on the printed circuit board PCB is exposed through the second gap G2. Thus, an external inspection means may connect to the printed circuit board PCB through the electric contact C to inspect the circuit board PCB or perform firmware upgrade on the circuit board PCB.

The electrical contact of the circuit board PCB is exposed through the second gap G2 so that it is not necessary to disassemble the elongate display-panel hollow roller 200 to connect for the external circuit to the circuit board PCB.

In the figure, one-dot chain line shows fastening points between the first and second support rings 230 and the first and second elongated half-circularly rounded plates 210 and 220. As shown, the fastening between the first and second support rings 230 and the first and second elongated half-circularly rounded plates 210 and 220 may be achieved radially. Such fastening may be accomplished using fastening means such as a screw.

Figure 14:
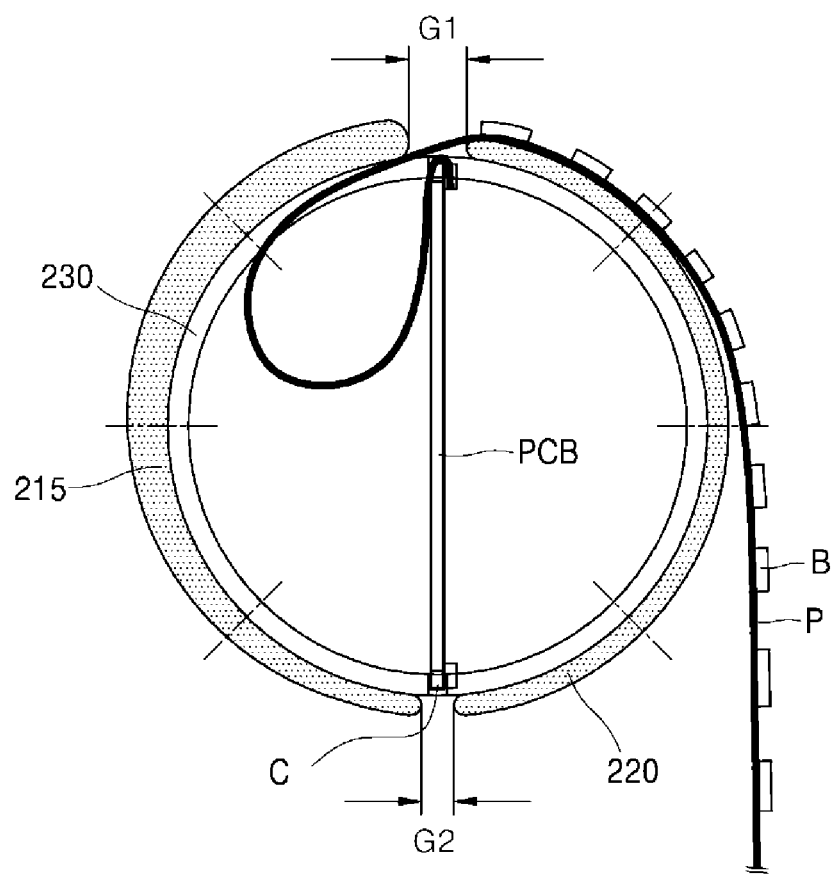
FIG. 14 shows the display panel assembled on the display-panel roller according to another embodiment of the present disclosure.

FIG. 14 shows a display panel coupled to a display-panel roller according to another embodiment of the present disclosure.

This embodiment may be applied to a case where reinforcement materials B are attached to the rear face of the display panel P and, thus, the thickness of the display panel P is increased. The reinforcement materials B for securing the flatness of the display panel P in the extended state may be provided on the rear face of the display panel P. The reinforcement material B may be attached to prevent sagging of the wiring disposed on the rear face of the display panel P.

In this case, the entire thickness of the display panel P becomes larger.

The display panel P is drawn through the first gap G1 formed between the first and second elongate half-circularly rounded plates 215 and 220. However, when the thicknesses of the first and second elongated half-circularly rounded plates 215 and 220 defining the first gap G1 are equal to each other, a step portion is formed in a portion of the display panel where the display panel P surrounds the elongate display-panel hollow roller 200 by one turn. In other words, in the portion where the display panel P surrounds the elongate display-panel hollow roller 200 by one turn, the corner of the reinforcement material B attached to the rear face of the display panel P contacts the front face (image display surface).

When the front face is repeatedly touched by the corner portion of the reinforcement material B attached to the rear face of the display panel P, scratches or the like may be damaged at the contact portion.

This embodiment is intended to solve such a problem. To this end, a difference in thickness between the first and second elongated half-circularly rounded plates 215,220 defining the first gap G1 through which the display panel P passes may correspond to the thickness of the display panel P.

As shown, the thickness of the first elongated half-circularly rounded plate 215 is greater by the thickness of the display panel P than the thickness of the second elongated half-circularly rounded plate 220. Specifically, the thickness of the portion of the first elongated half-circularly rounded plate 215 as adjacent to the gap G1 is greater by the thickness of the display panel P than the thickness of the second elongated half-circularly rounded plate 220.

Thus, when the display panel P is wound around the elongate display-panel hollow roller 200 by one turn, the step portion occurring near the gap G may be removed. As a result, the scratches otherwise generated by the contact between the corner of the reinforcement material B attached to the rear face of the display panel P and the front face of the display panel P may be suppressed.

As described above, the display device with the rollable display panel according to the present disclosure has the display-panel roller for winding the display panel, which is manufactured by assembling the divided first and second elongate half-circularly rounded plates and first and second support rings. As a result, the circuit board of the display panel may be fixed between the first and second support rings. The display panel may be drawn through the gap between first and second elongated half-circularly rounded plates. Further, the assembling between the display panel and the roller may be improved.

Further, when the thickness of the display panel is increased, a step is not formed at a portion of the display panel where the display panel starts along and on the display-panel roller. For this reason, the first and second elongate half-circularly rounded plates have different outer diameters, thereby reducing the occurrence of scratches in the front face of the display panel.

In the above description, numerous specific details are set forth in order to provide a thorough understanding of the present disclosure. The present disclosure may be practiced without some or all of these specific details. Examples of various embodiments have been illustrated and described above. It will be understood that the description herein is not intended to limit the claims to the specific embodiments described. On the contrary, it is intended to cover alternatives, modifications, and equivalents as may be included within the spirit and scope of the present disclosure as defined by the appended claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
   a rollable display panel configured to display an image;
   a support frame; and
   a display-panel roller rotatably coupled to the support frame, a first end of the rollable display panel being coupled to the display-panel roller, the display-panel roller including:
   first and second elongate half-circularly rounded plates attached to each other to face away each other to form a substantially cylindrical elongate inner space;
   first and second support annular rings spaced apart from each other within the substantially cylindrical elongate inner space, wherein the first and second support annular rings are disposed in the inner space, wherein an outer face of each of the first and second support annular rings face-contacts an inner face of each of the first and second elongate half-circularly rounded plates; and
   a circuit board connected to the rollable display panel, wherein the circuit board is disposed between the first and second support annular rings, wherein each of the first and second support annular rings has a groove formed therein, wherein the circuit board is partially inserted into the groove, wherein the circuit board has a shoulder at an edge thereof, and wherein the shoulder is inserted into the groove.

2. The device of claim 1, wherein the first and second support annular rings divide the inner space into three inner sub-spaces arranged in a length direction of the roller.

3. The device of claim 1, wherein a first elongate gap is formed between the first and second elongate half-circularly rounded plates, wherein the rollable display panel is structured to pass through the first gap.

4. The device of claim 3, wherein a second gap is formed between the first and second elongate half-circularly rounded plates, and wherein an electric contact on the circuit board is exposed outwardly through the second gap.

5. The device of claim 3, wherein portions of the first and second elongate half-circularly rounded plates adjacent to the first elongate gap have different thicknesses with a difference in the thicknesses corresponding to a thickness of the rollable display panel.

6. The device of claim 2, further comprising a driving means configured to rotate the display-panel roller with respect to the support frame, wherein the driving means is disposed in one of the three inner sub-spaces except for a middle inner sub-space thereof.

7. The device of claim 1, wherein the display-panel roller is elongate.

* * * * *